(12) United States Patent
Franz

(10) Patent No.: US 6,376,263 B1
(45) Date of Patent: Apr. 23, 2002

(54) NON-DESTRUCTIVE MODULE PLACEMENT VERIFICATION

(75) Inventor: Keenan Wynn Franz, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/489,897

(22) Filed: Jan. 24, 2000

(51) Int. Cl.⁷ .............................................. G01R 31/26
(52) U.S. Cl. ............................. 438/14; 438/15; 438/17; 438/975; 29/834
(58) Field of Search ................................ 438/15, 5, 10, 438/14, 17, 975, 800; 29/834

(56) References Cited

U.S. PATENT DOCUMENTS

| | | | |
|---|---|---|---|
| 4,721,365 A | * | 1/1988 | Nishimura ................. 349/152 |
| 5,092,033 A | * | 3/1992 | Nishiguchi et al. ........... 29/840 |
| 5,709,576 A | * | 1/1998 | Lippman et al. ............... 445/3 |
| 5,763,947 A | | 6/1998 | Bartley |

* cited by examiner

Primary Examiner—Wael Fahmy
Assistant Examiner—Christy Novacek
(74) Attorney, Agent, or Firm—Mark E. McBurney; Bracewell & Patterson, L.L.P.

(57) ABSTRACT

A method and system for verifying a correct orientation of a module during installation of the module into a circuit board mounting site. The module housing is symmetric in at least one respect such that the module may be positioned in at least one alternate orientation with respect to the mounting site in addition to the correct orientation. Within the module, a module test contact is electrically connected to a common plane mode contact. A mounting site test contact that engages the module test pin when the module is correctly aligned with respect to the mounting site is preselected to be tested upon placement of the module onto the mounting site. A test signal is applied to a conductive common plane within the mounting site to which a common plane mounting site contact is connected. Prior to installation of the module into the mounting site, the mounting site test contact is electrically isolated from the conductive common plane to which a test signal is applied. The module is tentatively connected to the mounting site. Upon connection of the module, only the mounting site test contact is tested to ensure that the module has been correctly positioned within respect to the mounting site.

7 Claims, 3 Drawing Sheets

NON-DESTRUCTIVE MODULE PLACEMENT VERIFICATION

TECHNICAL FIELD

The present invention relates in general to circuit board assembly, and in particular to a method and system for positioning a circuit module on a circuit board. More particularly, the present invention relates verifying a correct orientation of an circuit module during placement of the module into a socket within the circuit board.

DESCRIPTION OF THE RELATED ART

The process of manufacturing circuit boards, such as motherboards and the like, often includes the step of installing electronic circuitry housed within a computer chip or module (as utilized herein, "module" refers to either a chip or any other electronic device installable on a circuit board as illustrated hereinbelow). Such integrated circuit modules will include a box-like protective housing within which the circuitry is packaged. The housing will include an upper surface and multiple side surfaces. The lower surface opposing the upper surface includes multiple pins which serve as circuit contacts by which the internal circuitry within the module makes external electrical contact with elements on the circuit board.

The external electrical contact on a circuit board is provided to an installed module by what will be generically referred to as a "mounting site." There are various types of mounting sites including a surface mount in which the module resides above the upper surface of the circuit board. Another possible type of mounting surface is a socket mount in which the module is partially or fully embedded below the surface of the circuit board. Such mounting sites will include multiple electrical contact elements (referred to hereinafter as receptor contacts) for receptively engaging the module.

For surface type mounting sites, electrical contact between a module and the circuit board is typically accomplished utilizing either edge-mounted pins or ball grid array technology. For a socket type mounting site, edge conductors or pins are utilized to provide electrical contact to a module.

Correct placement of modules onto their respective mounting sites is important both in terms of overall system functionality and in terms of circuit board assembly efficiency. With the trend toward ball grid array technology the importance of correct module installation is even more pronounced. It can therefore be appreciated that a need exists for verifying the correct orientation of a symmetric circuit module during installation of the circuit module into a circuit board.

SUMMARY OF THE INVENTION

It is an object of the present invention to provide improved circuit board assembly.

It is another object of the present invention to provide a method and system for verifying the position of a circuit module.

It is still another object of the present invention to provide a method and system for verifying a correct orientation of an electronic circuit module during placement of the module into a socket within the circuit board.

The foregoing objects are achieved as is now described. A method and system are disclosed for verifying a correct orientation of a module during installation of the module into a circuit board mounting site. The module housing is symmetric in at least one respect such that the module may be positioned in at least one alternate orientation with respect to the mounting site in addition to the correct orientation. Within the module, a module test contact is electrically connected to a common plane mode contact. A mounting site test contact that engages the module test pin when the module is correctly aligned with respect to the mounting site is preselected to be tested upon placement of the module onto the mounting site. A test signal is applied to a conductive common plane within the mounting site to which a common plane mounting site contact is connected. Prior to installation of the module into the mounting site, the mounting site test contact is electrically isolated from the conductive common plane to which a test signal is applied. The module is tentatively connected to the mounting site. Upon connection of the module, only the mounting site test contact is tested to ensure that the module has been correctly positioned within respect to the mounting site.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
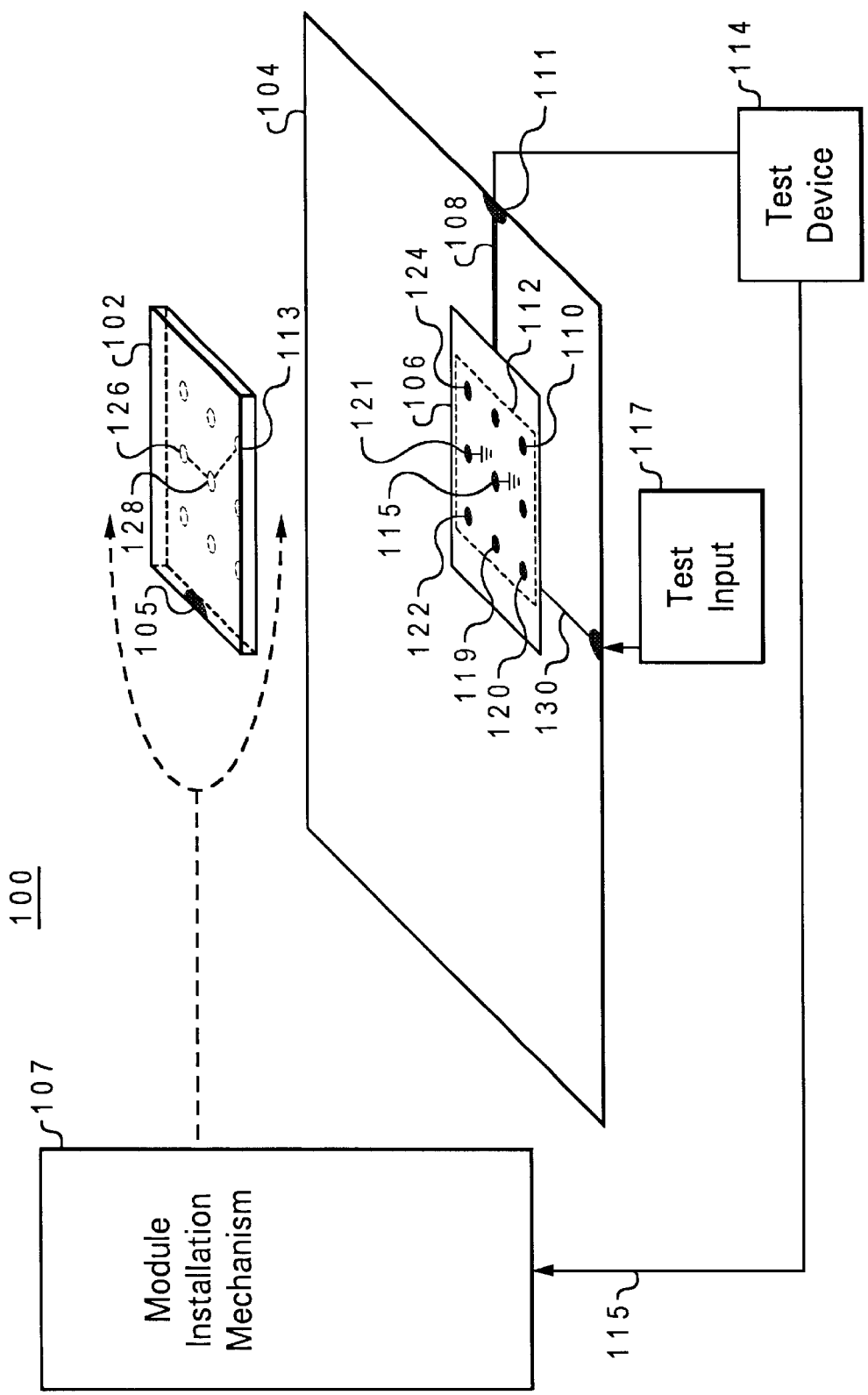
FIG. 1 illustrates a circuit board assembly fixture and placement tester in accordance with one embodiment of the method and system of the present invention.

With reference now to the figures, and in particular with reference to FIG. 1, there is illustrated a circuit board assembly fixture and placement tester 100 in accordance with one embodiment of the method and system of the present invention As shown in FIG. 1, circuit board assembly fixture 100 includes a circuit board 104 and a module 102. Circuit board 104 includes a mounting site 106 which is designed to receptively engage module 102. Mounting site 106 includes a contact array 112, comprising multiple contacts, which is designed to provide an electrical connection between corresponding pins on module 102 and circuit elements fabricated or otherwise installed onto circuit board 104. Within contact array 112, is at least one mounting site test contact 110 from which the positioning of module 102 with respect to circuit board 104 may be verified upon contact of the pins of module 102 with the contacts within contact array 112.

In accordance with the method and system of the present invention, circuit board 104 further includes a conductive path 108 for connecting one or more elements within circuit board 104 to a test pad 111. A test device 114 provides means for applying and/or reading a test signal to or from test pad 111, and is thus utilized to verify the correct placement of module 102 onto circuit board 104. It should be noted that although module 102 is depicted in FIG. 1 as having a square shape with four sides, the method and system of the present invention are also applicable to modules having any geometric disposition which would cause an incorrect insertion of a module into a circuit board mounting site to be a possibility.

As illustrated in FIG. 1, circuit board assembly and test fixture 100 includes a module installation mechanism 107 that receives a placement feedback signal 115 from test device 114. Mounting contact array 112 is a symmetric square array (3×3) and is therefore particularly amenable to the utility of the present invention. In addition to geometric alignment parameters, circuit board assembly and test fixture 100 establishes and utilizes additional module placement data for arrays having an asymmetric module housing (triangular, for example), or having an irregular contact pattern in order to verify that the module is in the proper orientation with respect to mounting site 106 prior to permanent installation. In the depicted example, one such alignment guideline is provided by a placement mark 105 which is utilized by module installation mechanism 107 as a reference for installing module 102 onto mounting site 106 in the correct orientation.

Despite the general reliability of utilizing external, structural guides such as placement mark 105, the need for additional placement verification is readily apparent within circuit board assembly fixture and placement tester 100. The symmetry of mounting site contact array 112 permits the physical placement of module 102 (having a similar 3×3 pin array pattern) in any of four possible orientations. As shown in FIG. 1, the method and system of the present invention provide a test feedback mechanism whereby additional placement verification information may be efficiently obtained.

As depicted in FIG. 1, mounting site contact array 112 includes amounting site test contact 110 for providing placement verification data to test device 114. A module test contact 113 engages mounting site test contact 110 when module 102 is correctly oriented with respect to mounting site 106. In an important feature of the present invention, mounting site test contact 110 may only be connected to a circuit board ground plane 130 through the internal connections with module ground pins 126 and 128. In a preferred embodiment of the present invention, a mounting site test contact is selected such that if a module is rotated in any of the three possible incorrect positions, a non-ground pin on the module will be coupled to mounting site test contact 110. The significance of this selection criterion underlies a fundamental aspect of the present invention whereby the selected mounting site test contact is electrically isolated from any other electrical element within mounting site 106. A mounting site ground contact 115 is connected to ground plane 130 that, during module installation, provides a convenient access point by which a test signal may be applied from test input device 117 in accordance with the depicted embodiment. As illustrated and explained in further detail in FIG. 3, test device 114 may then be utilized to detect a test response signal and verify positioning correctness with absolute certainty.

In order to assure a correct position test result, the selection of mounting site 110 must include verification that the following criteria are met: (1) mounting site test contact 110 is not connected to ground plane 130; and (2) mounting site test contact 110 does not occupy a position within array 112 that is symmetric with respect to a ground contact within the array. Therefore, the selection of mounting site test contact 110 includes verification that none of three symmetrically oriented contacts, 120, 122, and 124, are ground contacts connected to conductive ground plane 130 within circuit board 104.

In accordance with the mounting site test contact selection criterion (1) described above, mounting site contacts 115 and 121 are excluded as test contact choices because they are ground contacts connected to ground plane 130. Selection criterion (2) excludes mounting site contact 119 as a test contact selection due to its relative location with respect to ground contact 121 which makes it possible for a module ground contact 126 to connect contact 119 to ground plane 130 if module 102 is incorrectly positioned by 90° counterclockwise or 270° clockwise.

In accordance an important aspect of the embodiment depicted in FIG. 1, after mounting site test contact 110 has been selected in accordance with the aforementioned criteria, module installation device 107 is utilized to tentatively orient module 102 in accordance with a predetermined positioning mark 105. In accordance with the method and system of the present invention, module installation device 107 tentatively places module 102 onto mounting site 106. A test signal is applied from test input device 117 to ground plane 130. While module 102 is placed onto mounting site 106, a sensor within test device 114 is utilized to verify a correct module placement by sensing the voltage level at selected mounting test contact 110. If the voltage detected by the sensor within test device 114 assumes a value equal to that applied to ground plane 130 by test input device 117, a correct placement has been verified. In response to such a verification, test device 114 delivers either a "correct placement" indication or no indication, such that module installation device continues the installation process whereby module 102 is attached to mounting site 106. If the ground plane signal is not received by the sensor, test device 114 generates and delivers an error massage within test feedback signal 115.

In a preferred embodiment of the present invention, module installation mechanism 107 responds to such an error message by removing module 102 from mounting site 104 and performing a re-orientation and testing procedure. The embodiment illustrated in FIG. 1 utilizes a ground contact as a convenient test reference since circuit boards generally includes a ground plane which is easily accessible a possible test input signal as illustrated next with reference to FIG. 3. It should be noted that any similar conductive path, such as a voltage plane can be utilized without departing from the spirit or scope of the present invention. It should be further noted with reference to FIGS. 1 and 2, the during module installation, the conductive ground plane is not connected to any actual system ground and is thus able to carry an externally applied signal.

Figure 2:
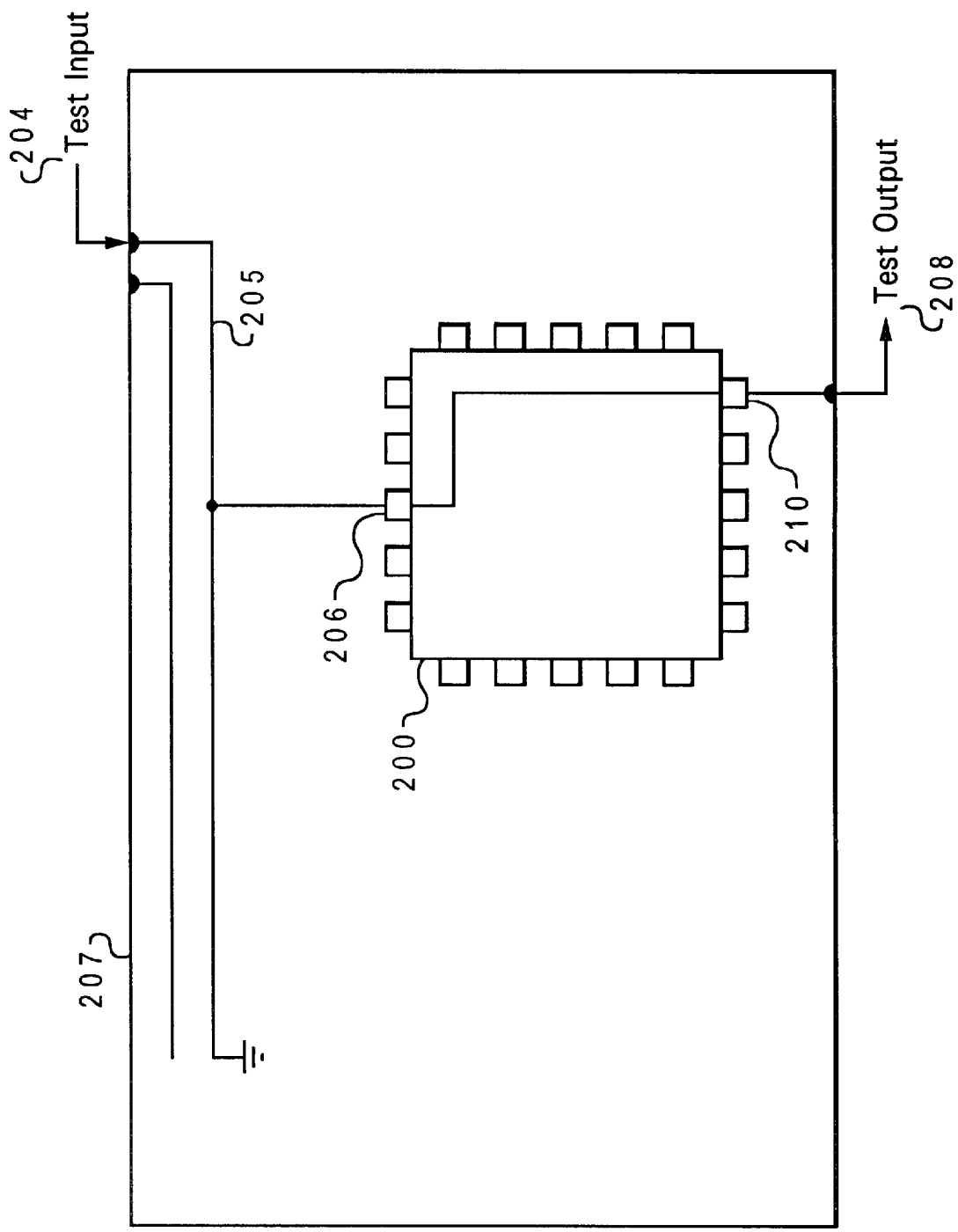
FIG. 2 depicts a circuit module test system in accordance with an alternate embodiment of the method and system of the present invention.

FIG. 2 illustrates testing an integrated circuit (IC) module 200 in accordance with one embodiment of the present invention. It should be noted that IC module 200 includes edge-mounted contacts rather than the array of ball grid contacts depicted in module 102. The applicability of the method and system of the present invention is thus not limited by the physical construction of any particular module or mounting site contact. As illustrated in FIG. 2, IC module 200 may be placed in a circuit board 207 and subjected to position verification testing as described with reference to FIG. 1.

A module test pin 210 is connected to a ground pin 206 within IC module 200. The mounting site test contact to which module test pin 210 is designed to engage has been pre-selected in accordance with the selection criteria explained with reference to FIG. 1. As shown in FIG. 2, an external test input signal is applied to a ground plane within circuit board 207. During assembly of circuit board 207, ground plane 205 is an electrically isolated conductor which is readily accessible for testing purposes. In the embodiment of the present invention illustrated in FIG. 2, a test input 204 is applied to ground plane 205. A test device, such as test device 214 in FIG. 2, is then utilized to receive and analyze a test response signal 208 from the designated mounting site test contact.

Figure 3:
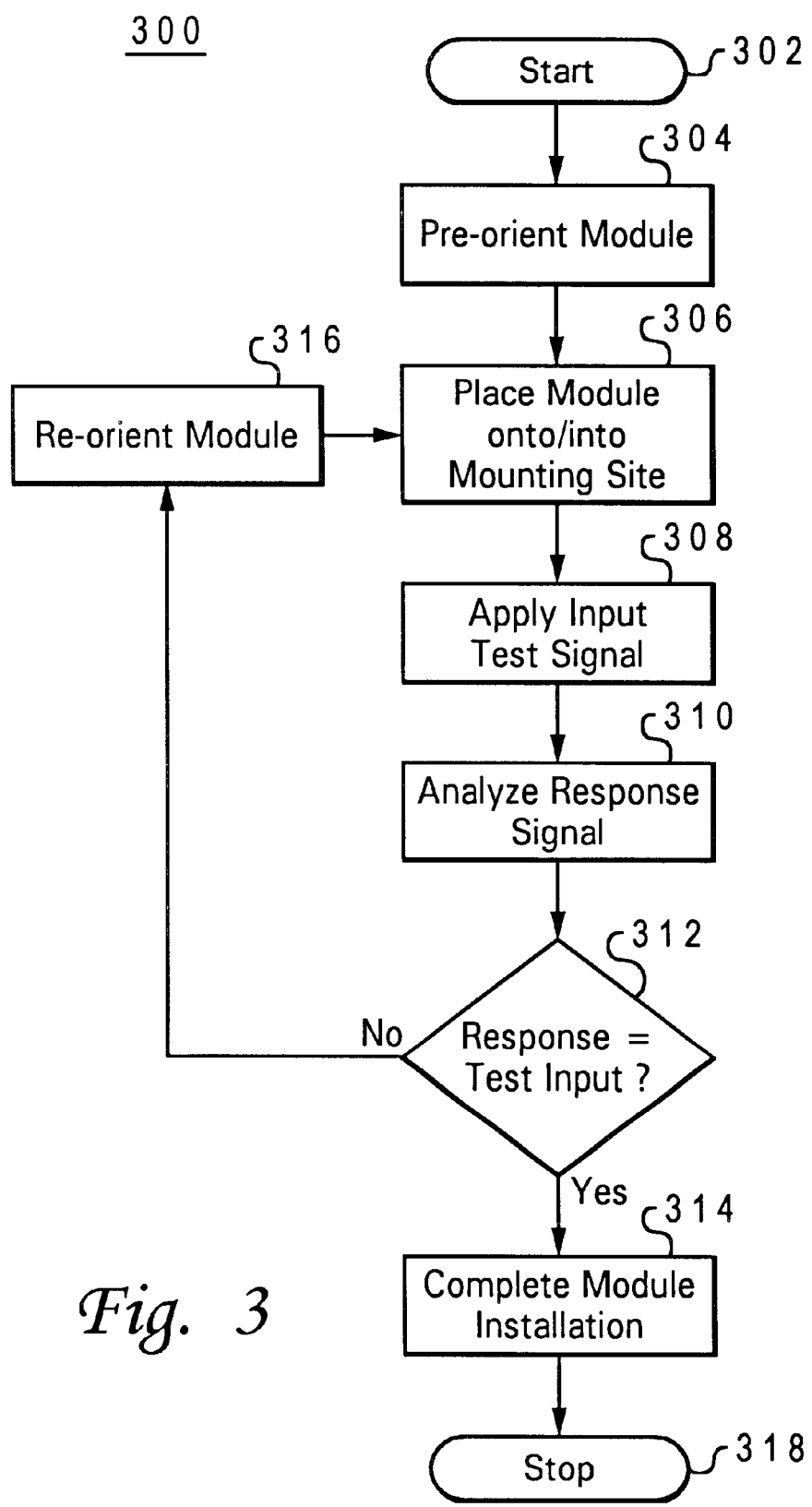
FIG. 3 is a high-level logic diagram illustrating module placement verification steps performed during module installation in accordance with the teachings of the present invention.

With reference now to FIG. 3, there is illustrated a high-level logic diagram 300 illustrating module placement verification steps performed during module installation in accordance with the teachings of the present invention. The embodiment of the present invention depicted by the method steps of logic diagram begins at start block 302 and proceeds as shown at step 304 with a pre-determined orientation of a module which is to be installed within an assembly and test fixture as depicted in FIG. 1. The pre-orientation depicted at step 304 may include utilizing a circuit board assembly device, such as that shown in FIG. 1, to move, rotate, or otherwise position the module with respect to a mounting site which typically resides on a circuit board.

Next, as depicted at step 306, the module is placed into or onto a mounting site in accordance with the orientation at step 304. Proceeding to steps 308 and 310, a test method is illustrated in which a test signal is applied to a common conductive plane on the circuit board (step 308) and a response therefrom is received and analyzed (step 310). It should be noted that steps 308 and 310 may be performed simultaneously and immediately following a tentative placement depicted at step 306.

Proceeding to inquiry step 312, an input/ouput signal comparison is performed to verify the correctness of the response signal. In one embodiment of the present invention in which the test contacts for the mounting site and the module are ground or voltage supply contacts, and as illustrated at step 312, such verification comprises ensuring that the output response signal obtained through the mounting site test contact is the same as the input test signal applied to a ground or voltage supply plane on the circuit board.

If the correctness of the response signal is verified, then, as depicted at steps 314 and 318, the installation of the module is completed and the process ends. Otherwise, as illustrated at step 316 the module is re-oriented and the placement, testing, and verification steps 306, 308, 310 and 312 are again performed. In this manner a circuit board assembly mechanism and a test fixture may operate in an interactive manner to ensure proper installation of the module.

While the invention has been particularly shown and described with reference to a preferred embodiment, it will be understood by those skilled in the art that various changes in form and detail may be made therein without departing from the spirit and scope of the invention.

What is claimed is:

1. A method for verifying a correct orientation of a module during installation of said module into a mounting site comprising a plurality of mounting site contacts, wherein said mounting site resides fixedly on a circuit board having a common conductive plane, and wherein said plurality of mounting site contacts form a symmetric array such that said module may be positioned in at least one alternate orientation with respect to said mounting site in addition to a correct orientation, said module including a module test contact and at least one alternate module contact that is symmetrically oriented with respect to said module test contact such that said alternate module contact is aligned with a mounting site test contact at said at least one alternate orientation, said method comprising the steps of:

selecting said mounting site test contact within said plurality of mounting site contacts to which said module test contact is aligned when said module is correctly oriented with respect to said mounting site such that said mounting site test contact is connected to said common conductive plane through said module test contact only when said module is installed in said correct orientation;

placing said module onto said mounting site; and testing said selected mounting site test contact following said placing step, wherein said testing comprises:

applying an input test signal to said common conductive plane; and verifying correctness of a test response signal from said mounting site test contact.

2. The method of claim 1, wherein said mounting site test contact is electrically isolated within said circuit board from said common conductive plane, and wherein said module test contact is internally connected within said module to a common plane module contact such that said common plane mounting site contact is connected to said common conductive plane when said module is correctly oriented with respect to said mounting site.

3. The method of claim 2, wherein said verifying step comprises determining that said test response signal is the same as said input test signal.

4. The method of claim 1, wherein said at least one alternate module contact is electrically isolated within said module from said module test contact.

5. The method of claim 1, wherein said module comprises a square array of module contacts such that said module may be positioned in three alternate orientations with respect to said mounting site in addition to said correct orientation, said selecting step comprising selecting a mounting site contact that corresponds to a voltage supply or ground contact of said module from among said plurality of mounting site contacts such that no other voltage supply or ground contact within said square array of module contacts is aligned with said mounting site test contact in each of said three alternate orientations of said module.

6. The method of claim 1, wherein said placing step is preceded by the step of orienting said module such that said module assumes a pre-determined orientation with respect to said mounting site.

7. The method of claim 1, wherein the selected mounting site test contact is a dedicated contact, and wherein said selecting step is preceded by the step of incorporating within said module at least one dedicated module test contact that is aligned with said mounting site test contact upon correct placement of said module onto said mounting site.

* * * * *